US008988123B2

(12) United States Patent
Yang et al.

(10) Patent No.: US 8,988,123 B2
(45) Date of Patent: Mar. 24, 2015

(54) SMALL AREA LOW POWER DATA RETENTION FLOP

(71) Applicant: NVIDIA Corporation, Santa Clara, CA (US)

(72) Inventors: Ge Yang, Dublin, CA (US); Hwong-Kwo Lin, Palo Alto, CA (US); Xi Zhang, San Jose, CA (US); Jiani Yu, Fremont, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 13/715,969

(22) Filed: Dec. 14, 2012

(65) Prior Publication Data

US 2014/0167828 A1   Jun. 19, 2014

(51) Int. Cl.
*H03K 3/289* (2006.01)
*H03K 3/037* (2006.01)

(52) U.S. Cl.
CPC .................................. *H03K 3/0375* (2013.01)
USPC ......................................... 327/202; 327/203

(58) Field of Classification Search
CPC ... H03K 3/037; H03K 3/0372; H03K 3/0375; H03K 3/26; H03K 3/28; H03K 3/286; H03K 3/287; H03K 3/289
USPC .................. 327/202–203, 206–214
See application file for complete search history.

(56) References Cited

U.S. PATENT DOCUMENTS

| | | | |
|---|---|---|---|
| 4,256,411 A | 3/1981 | Podosek | |
| 5,821,791 A | 10/1998 | Gaibotti et al. | |
| 5,903,171 A | 5/1999 | Shieh | |
| 6,310,501 B1 | 10/2001 | Yamashita | |
| 6,396,309 B1 | 5/2002 | Zhao et al. | |
| 6,442,721 B2 | 8/2002 | Whetsel | |
| 6,472,920 B1 | 10/2002 | Cho et al. | |
| 6,580,411 B1 | 6/2003 | Kubota et al. | |
| 6,714,060 B2 | 3/2004 | Araki | |
| 6,747,485 B1 | 6/2004 | Suryanarayana et al. | |
| 7,057,421 B2 | 6/2006 | Shi et al. | |
| 7,196,552 B2 | 3/2007 | Zhou | |
| 7,304,903 B2 | 12/2007 | Mukhopadhyay et al. | |
| 7,418,641 B2 | 8/2008 | Drake et al. | |
| 7,652,513 B2 * | 1/2010 | Rao et al. ...................... | 327/203 |
| 7,760,117 B1 | 7/2010 | Chou | |
| 7,908,500 B2 * | 3/2011 | Westwick et al. ............. | 713/323 |
| 8,742,796 B2 | 6/2014 | Dally et al. | |
| 2004/0160244 A1 | 8/2004 | Kim | |
| 2004/0243896 A1 | 12/2004 | Jaber et al. | |
| 2005/0040856 A1 | 2/2005 | Ramaraju et al. | |
| 2005/0108604 A1 | 5/2005 | Wong | |
| 2006/0049852 A1 | 3/2006 | Park et al. | |
| 2008/0270862 A1 | 10/2008 | Drake et al. | |
| 2008/0303573 A1 * | 12/2008 | Hsieh et al. .................... | 327/199 |
| 2010/0102890 A1 | 4/2010 | Stratz et al. | |
| 2010/0332924 A1 | 12/2010 | Ziaja et al. | |

FOREIGN PATENT DOCUMENTS

JP   2004214997   7/2004

* cited by examiner

*Primary Examiner* — An Luu

(57) ABSTRACT

Small area low power data retention flop. In accordance with a first embodiment of the present invention, a circuit includes a master latch coupled to a data retention latch. The data retention latch is configured to operate as a slave latch to the master latch to implement a master-slave flip flop during normal operation. The data retention latch is configured to retain an output value of the master-slave flip flop during a low power data retention mode when the master latch is powered down. A single control input is configured to select between the normal operation and the low power data retention mode. The circuit may be independent of a third latch.

8 Claims, 3 Drawing Sheets

SMALL AREA LOW POWER DATA RETENTION FLOP

FIELD OF INVENTION

Embodiments of the present invention relate to the field of integrated circuit design and manufacture. More specifically, embodiments of the present invention relate to systems and methods for small area low power data retention flops.

BACKGROUND

The term "flop," or "flip-flop," is generally used to describe or to refer to a clocked electronic circuit having two stable states, which is used to store a value. A flop generally comprises two latch circuits. The term "retention" flop is generally used to describe or to refer to a flop that is capable of retaining data while a portion of the circuit, e.g., input and/or output portions, is powered off.

Under the conventional art, a retention flop is generally formed by adding an additional, or "third" latch to a flop, sometimes known as a "balloon" flop. For example, the third latch retains a data value while portions of the rest of the flop are powered down. Unfortunately, such conventional art designs require an undesirably large die area, deleterious increases in a number of circuit elements, an unfavorable increase in the number and complexity of control signals required to operate the third latch in a "power down" mode, and a disadvantageous increase in power requirements, in both "normal" and "power down" modes of operation.

SUMMARY OF THE INVENTION

Therefore, what is needed are systems and methods for small area low power data retention flops. What is additionally needed are systems and methods for small area low power data retention flops that retain a value when a portion of the circuit is powered down. A further need exists for systems and methods for small area low power data retention flops that are compatible and complementary with existing systems and methods of integrated circuit design, manufacturing and test. Embodiments of the present invention provide these advantages.

In accordance with a first embodiment of the present invention, a circuit includes a master latch coupled to a data retention latch. The data retention latch is configured to operate as a slave latch to the master latch to implement a master-slave flip flop during normal operation. The data retention latch is configured to retain an output value of the master-slave flip flop during a low power data retention mode when the master latch is powered down. A single control input is configured to select between the normal operation and the low power data retention mode. The circuit may be independent of a third latch.

In accordance with another embodiment of the present invention, a data retention flip flop includes a master latch configured to be powered down responsive to activation of a single control input. A slave latch is configured to accept a value from the master latch and to retain the value when the master latch is powered down. The slave latch is further configured to output the value responsive to deactivation of the single control input. The slave latch may be configured to receive an always-on supply voltage.

In accordance with yet another embodiment of the present invention, a circuit includes a master latch. The master latch includes a first inverter coupled to an input of a first NAND gate, a first pass gate for selectively coupling an output of the first NAND gate to an input of the first inverter and a second pass gate for selectively coupling the an input of the first inverter to a circuit input.

The circuit also includes a data retention latch. The data retention latch includes a second NAND gate coupled to an input of a second inverter and a third pass gate for selectively coupling an output of the inverter to an input of the second NAND gate. The circuit also includes a fourth pass gate for selectively coupling an output of the first inverter to the input of the second NAND gate.

The circuit further includes a control circuit. The control circuit includes a third NAND gate accepting as input a latch clock signal and a low power data retention control signal. An output of the third NAND gate is coupled to a control input of the first, second, third and fourth pass gates, and the output of the third NAND gate is inverted and coupled to the opposite control inputs of the first, second, third and fourth pass gates.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings are not drawn to scale.

DETAILED DESCRIPTION

Reference will now be made in detail to various embodiments of the invention, mitigating external influences on long signal lines, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Small Area Low Power Data Retention Flop

Figure 1:
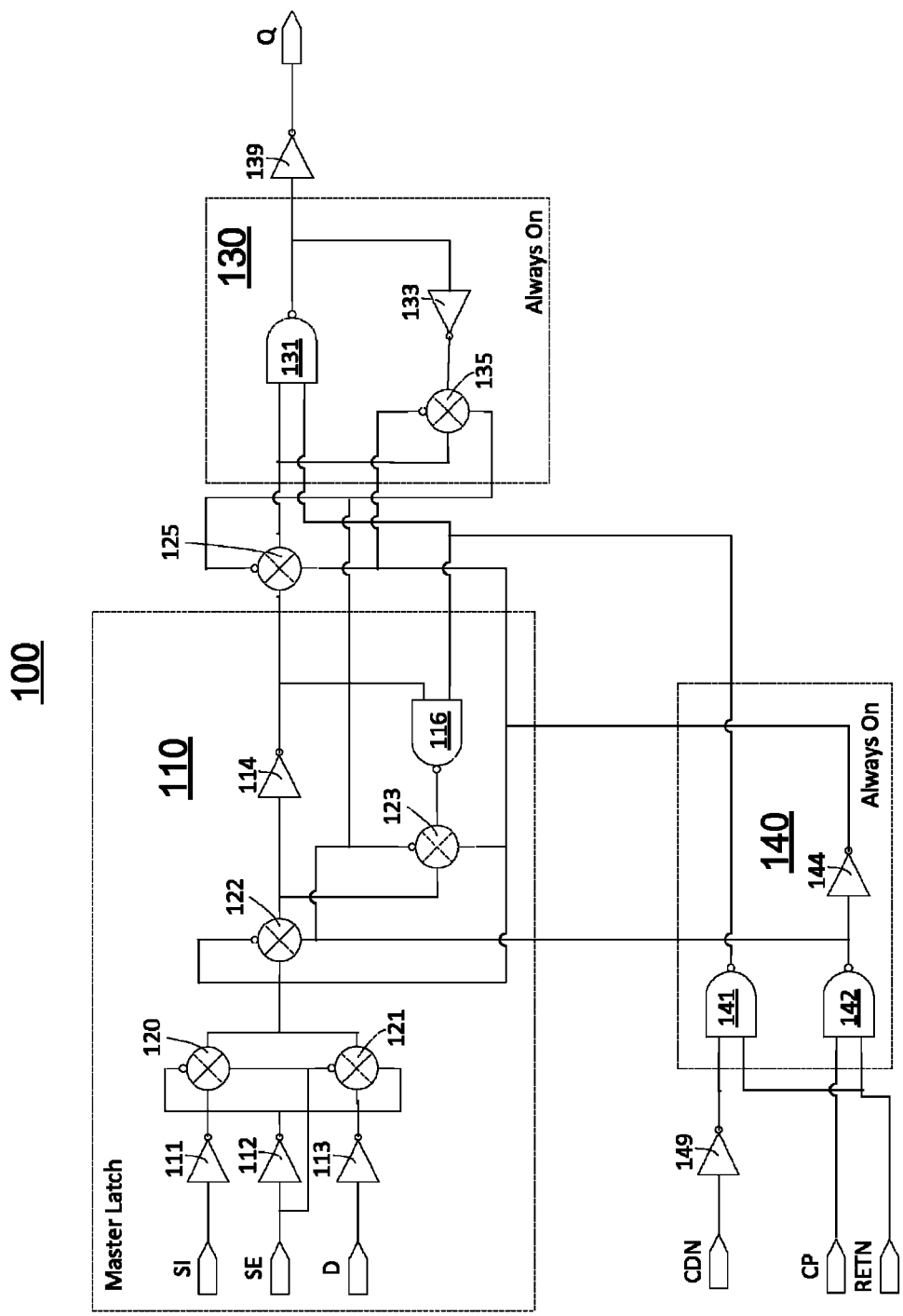
FIG. 1 illustrates a small area low power data retention flop, in accordance with embodiments of the present invention.

FIG. 1 illustrates a small area low power data retention flop 100, in accordance with embodiments of the present invention. Data retention flop 100 comprises three major sub-circuits, a master latch 110, a data retention latch 130, and a power down control circuit 140. Data retention latch 130 and power down control circuit 140 should always have power applied in order for data retention flop 100 to maintain its value. Master latch 110 may be powered down, responsive to the control signal "RETN," thereby beneficially saving both dynamic and static power. Overall, data retention flop 100 implements a "D-Q" type flip flop when powered and the "RETN" control signal is high.

Master latch 110 comprises inverters 111, 112, 113 and 114 of conventional design. For example, the devices have a process-nominal threshold voltage, $V_{th}$, which may be the same (in magnitude) for all devices. Master latch 110 also comprises pass gates 120, 121, 122 and 123 of conventional design. Master latch 120 further comprises a NAND gate 116 of conventional design. The input "SI" accepts a scan input. The input "SE" accepts a scan enable signal. The "D" input is a data input for the flip flop function.

Data retention latch 130 comprises NAND gate 131, inverter 133 and pass gate 135, all of conventional design. Pass gate 125 is between master latch 110 and data retention latch 130. In normal operation, data retention latch 130 functions as a "slave" latch in a master/slave configuration of a D-Q flip flop. Data retention latch 130 produces, via inverter 139, the output "Q." It is to be appreciated that inverter 139 is outside of the "always on" region of data retention latch 130. For example, inverter 139 is not required to drive the output signal "Q" while the latch is in a power retention mode.

Power down control circuit 140 comprises NAND gates 141 and 142, and inverter 144, of conventional design. Power down control circuit 140 accepts a clock signal "CP," which controls the propagation of a signal from the D input to the Q output. Power down control circuit 140 also accepts a direct clear signal "CDN," as is known in flip-flop implementations. Inverter 149 is outside of the "always on" region of power down control circuit 140. For example, inverter 149 is not required to invert the "CDN" signal when data retention flop 100 is in a low power, e.g., quiescent, mode.

Power down control circuit 140 accepts the control input "RETN," an active-low signal that controls data retention flop 100 to save its state and prepare for entry into a low power, data retention, quiescent mode of operation. It is appreciated that "RETN" does not actually control power to any circuitry. As will be discussed further below, the "RETN" signal should be asserted prior to removal of power from any circuitry.

The control signal "RETN" gates the clock signal "CP" at NAND gate 142 of power down control circuit 140. For example, a clock signal, even if toggling, will not cause spurious data propagation while the "RETN" signal is active. The control signal "RETN" also indirectly controls the operation of pass gates 122, 123, 125 and 135.

Figure 2:
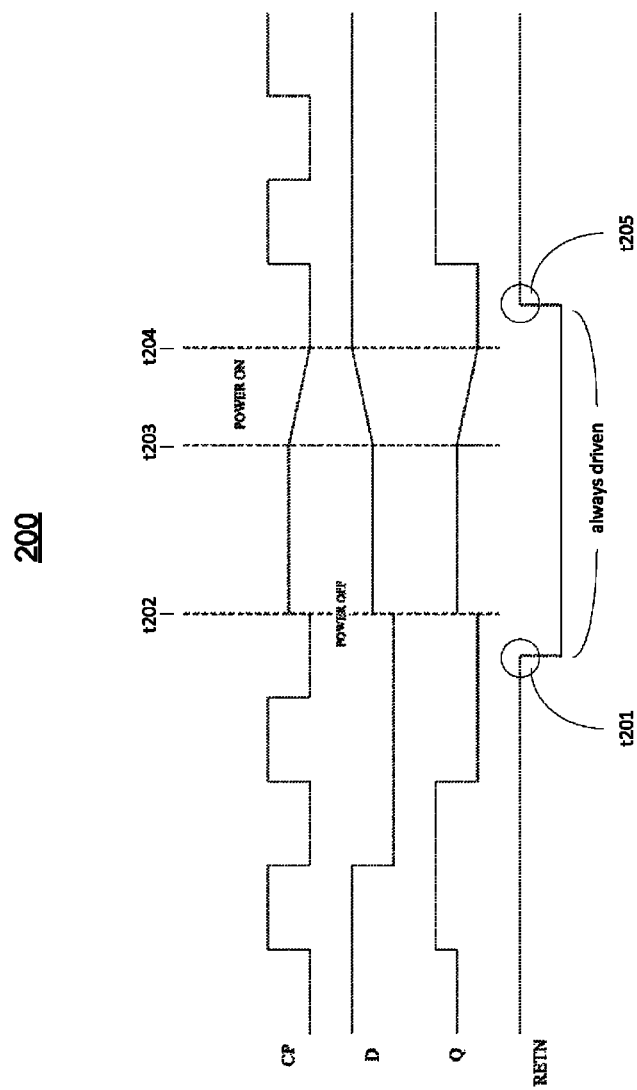
FIG. 2 illustrates an exemplary timing diagram describing operation of small area low power data retention flop, in accordance with embodiments of the present invention.

FIG. 2 illustrates an exemplary timing diagram 200 describing operation of small area low power data retention flop 100, in accordance with embodiments of the present invention. Time is represented on the horizontal axis, increasing to the right. Prior to time t201, e.g., to the left of time t201, data retention flop 100 operates as a conventional D-Q type flip flop. For example, on a rising edge of clock signal CP, the output Q transitions from a high to a low, responsive to a similar transition on the D input.

At time t201, the low power control signal RETN is asserted (low), indicating that the data retention flop 100 should begin data retention operation. At time t202, some duration after t201, power is removed from master latch 110, and other circuit elements outside of the "always on" partitions, e.g., power is removed from pass gate 125 and inverters 139 and 149 of FIG. 1. The data retention flop 100 is holding its value while power is removed. It is to be appreciated that while the values of CP, D and Q float and/or are indeterminate between time t202 and time t203, the low power control signal RETN is always driven. For example, the low power control signal RETN is always determined, whether asserted or deasserted.

At time t203, power begins to turn on. Between time t203 and time t204, the signals CP, D and Q are shown "drifting" toward defined states. At time t204, power is sufficient for normal operation, e.g., as indicated by a "power good signal" (not shown). At time t205, the low power control signal RETN is deasserted (high), and normal operation of data retention flop 100 as a conventional D-Q type flip flop resumes.

It is appreciated that at time t205, the Q value output from data retention flop 100 is the same value that was latched prior to the assertion of the low power control signal RETN at time t201.

Figure 3:
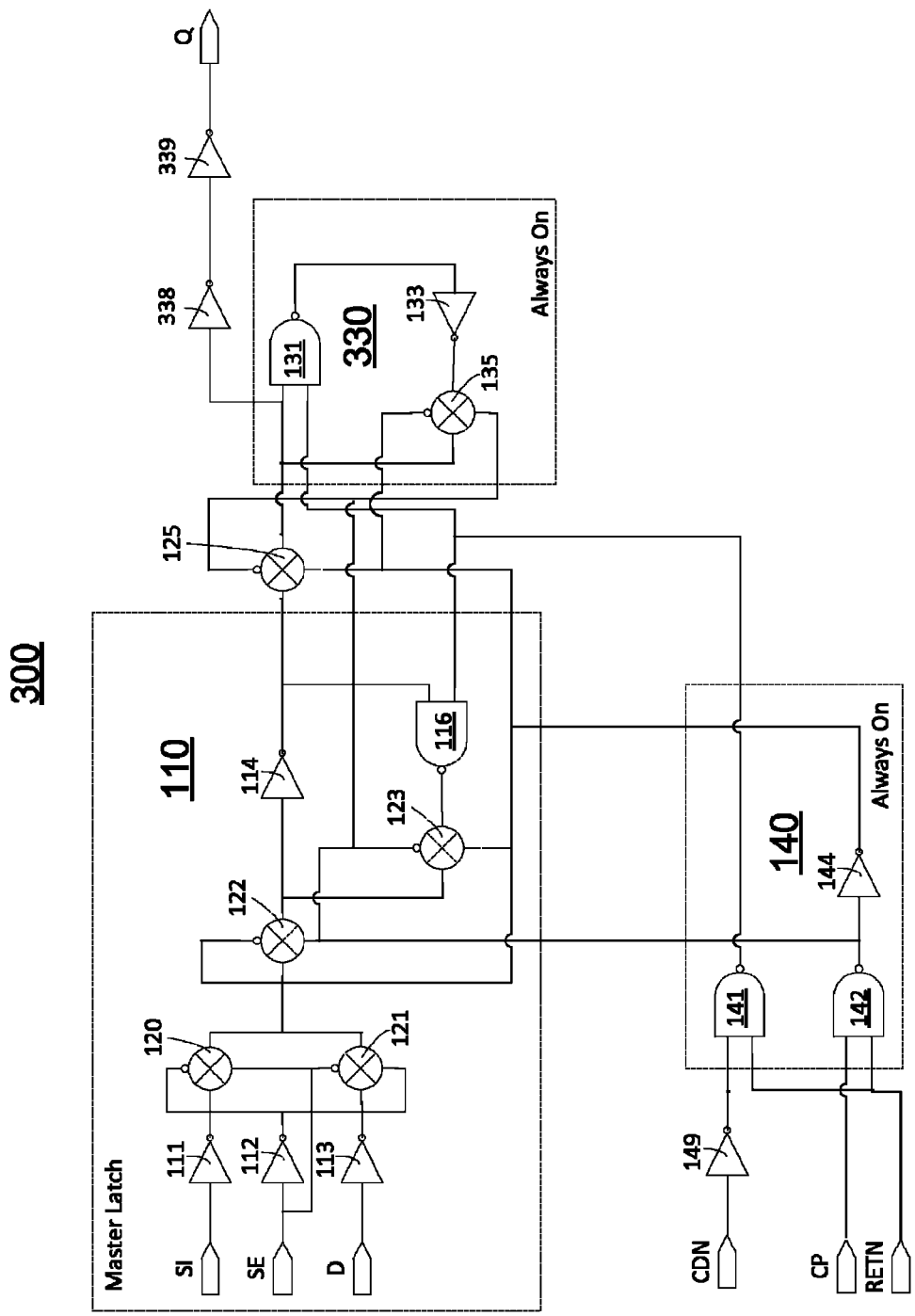
FIG. 3 illustrates a small area low power data retention flop, in accordance with embodiments of the present invention.

FIG. 3 illustrates a small area low power data retention flop 300, in accordance with embodiments of the present invention. Data retention flop 300 is slightly different from data retention flop 100 as illustrated in FIG. 1. Data retention flop 300 comprises master latch 110 and power down control circuit 140. Data retention flop 300 also comprises inverter 149 and pass gate 125.

Data retention flop 300 further comprises data retention latch 330. Data retention latch 330 differs from data retention latch 130 (FIG. 1) in that the inverter that drives the output Q (inverter 139 in latch 130) does not take its input from the output of NAND gate 131. Rather, in data retention flop 300, two inverters, 338 and 339, take their input from the output of pass gate 125 to produce the Q output. The logical function of data retention flop 300 is the same as that of data retention flop 100 (FIG. 1). The change to the final output configuration may lessen the overall delay of data retention flop 300 in comparison to the delay of data retention flop 100 (FIG. 1). For example, a delay of inverter 338 may be less than a delay of NAND gate 131.

Embodiments in accordance with the present invention use less die area, e.g., comprise fewer circuit elements, and have less leakage current, e.g., have less circuitry power on in a retention mode, in comparison with the conventional art. In addition, since embodiments in accordance with the present invention do not utilize a third latch, as is common under the conventional art, design for testability of such embodiments is more straight forward than under the conventional art. For example, circuits comprising a third latch may require a complicated custom design for testability flow.

Embodiments in accordance with the present invention do not require the illustrated scan elements shown as part of master latch 110 (FIGS. 1 and 3), and are well suited to "scan-less" embodiments. For example, inputs SI and SE, inverters 111 and 112, and pass gates 120 and 121 may be eliminated to remove a scan capability. The output of inverter 113 would then be directly connected to the input of pass gate 122. Those of skill in the art will understand how to generalize the disclosures herein to other types of flip flops, e.g., asynchronous clear/set, set/reset and the like.

Embodiments in accordance with the present invention provide systems and methods for small area low power data retention flops. In addition, embodiments in accordance with the present invention provide systems and methods for small area low power data retention flops. Further, embodiments in accordance with the present invention provide systems and methods for small area low power data retention flops that are compatible and complementary with existing systems and methods of integrated circuit design, manufacturing and test.

Various embodiments of the invention are thus described. While the present invention has been described in particular embodiments, it should be appreciated that the invention should not be construed as limited by such embodiments, but rather construed according to the following claims.

What is claimed is:

1. A circuit comprising:
   a master latch comprising:
   a first inverter coupled to an input of a first NAND gate;
   a first pass gate for selectively coupling an output of said first NAND gate to an input of said first inverter;
   a second pass gate for selectively coupling said an input of said first inverter to a circuit input;
   a data retention latch comprising:
   a second NAND gate coupled to an input of a second inverter;
   a third pass gate for selectively coupling an output of said second inverter to an input of said second NAND gate;
   a fourth pass gate for selectively coupling an output of said first inverter to said input of said second NAND gate;
   a control circuit comprising:
   a third NAND gate accepting as input a latch clock signal and a low power data retention control signal,
   wherein an output of said third NAND gate is coupled to a control input of said first, second, third and fourth pass gates, and
   wherein said output of said third NAND gate is inverted and coupled to the opposite control input of said first, second, third and fourth pass gates.

2. The circuit of claim 1 wherein said output of said third NAND gate is coupled to the non-inverted control inputs of said second and third pass gates.

3. The circuit of claim 1 wherein said output of said third NAND gate is coupled to the inverted control inputs of said first and fourth pass gates.

4. The circuit of claim 1 wherein said fourth pass gate is configured to be powered down in a low power data retention mode.

5. The circuit of claim 1 wherein said first inverter, said first NAND gate and said first and second pass gates are configured to be powered down in a low power data retention mode.

6. The circuit of claim 1 further comprising:
   a fourth inverter for accepting a clear data control signal, and a fourth NAND gate for combining said clear data control signal with said low power data retention control signal,
   wherein the output of said fourth NAND gate is coupled to an input of said first and second NAND gates.

7. The circuit of claim 1 further comprising:
   a fifth inverter coupled to an output of said second NAND gate and for driving an output signal of said circuit.

8. The circuit of claim 1 further comprising:
   a fifth inverter coupled to an output of said fourth pass gate for driving a sixth inverter for driving an output signal of said circuit.

* * * * *